United States Patent
Ou et al.

(10) Patent No.: US 6,750,397 B2
(45) Date of Patent: Jun. 15, 2004

(54) THERMALLY ENHANCED SEMICONDUCTOR BUILD-UP PACKAGE

(75) Inventors: In-De Ou, Kaohsiung (TW); Yi-Chuan Ding, Kaohsiung (TW); Kun-Ching Chen, Tainan (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/075,226

(22) Filed: Feb. 15, 2002

(65) Prior Publication Data

US 2003/0155145 A1 Aug. 21, 2003

(51) Int. Cl.[7] .............................................. H01L 23/02
(52) U.S. Cl. ...................... 174/52.4; 257/700; 257/704; 257/778; 257/738
(58) Field of Search ............................... 174/52.2, 52.3, 174/52.4, 260; 257/700, 704, 778, 737, 738

(56) References Cited

U.S. PATENT DOCUMENTS

| | | | | |
|---|---|---|---|---|
| 5,371,404 A | * | 12/1994 | Juskey et al. | 257/659 |
| 5,422,513 A | * | 6/1995 | Marcinkiewicz et al. | 257/668 |
| 6,201,701 B1 | * | 3/2001 | Linden et al. | 361/720 |
| 6,271,469 B1 | | 8/2001 | Ma et al. | 174/52.4 |
| 6,492,723 B2 | * | 12/2002 | Suyama | 257/700 |

* cited by examiner

*Primary Examiner*—Hung V. Ngo
(74) *Attorney, Agent, or Firm*—Troxell Law Office PLLC

(57) ABSTRACT

A semiconductor build-up package includes a die, a metal carrier, and a plurality of dielectric layers. The metal carrier has a surface with a cavity for supporting the die. The surface of metal carrier is coplanar to the active surface of die for building up a plurality of dielectric layers. Each dielectric layer has metal columns for inner electrical connection. The metal carrier covers passive surface and sides of the die with a larger area for heat dissipating, so the heat generated from the die is dissipated fast through the metal carrier.

11 Claims, 1 Drawing Sheet

THERMALLY ENHANCED SEMICONDUCTOR BUILD-UP PACKAGE

FIELD OF THE INVENTION

The present invention is relating to a semiconductor package, more particularly to a thermally enhanced semiconductor build-up package with a metal carrier.

BACKGROUND OF THE INVENTION

The chip is trending to small size and high density (having lots of terminals) for CSP (chip scale package) or FC (flip chip) package. Therefore, the intervals between adjacent contacts of die are evolved to become very small, resulting in difficulty of planting the solder balls and causing the problem of surface mounting fail. So that reliability and yield of semiconductor packages would decrease greatly, and the technology of CSP (chip scale package) or FC (flip chip) package is unable to be worked out.

In order to solve the problems mentioned above, a semiconductor package is brought up from U.S. Pat. No. 6,271,469 "direct build-up layer on an encapsulated die package". As shown in FIG. 1, the semiconductor build-up package 100 comprises a die 110, an encapsulating material 120 and a plurality of dielectric layers 131 and 132. The die 110 has an active surface 111 forming a plurality of contacts 114. The encapsulating material 120 covers the passive surface 112 and sides 113 of the die 110 for protecting the die 110. The surface of the encapsulating material 120 is coplanar to the active surface 111 of the die 110 for providing a planar area that is necessary for build-up package. The first dielectric layer 131 is formed on the area that is defined by the die 110 and the encapsulating material 120, such as silicon oxide or silicon nitrogen. The first dielectric layer 131 has a plurality of conductive traces 141 that are conductive metals such as copper, aluminum, or alloys thereof. The second dielectric layer 132 is formed above the first dielectric layer 131 and conductive traces 141 and has a plurality of conductive plugs 142. The conductive pads 143 are formed on the second dielectric layer 132. A conductive path is constituted by one of conductive traces 141 and the corresponding conductive columns 142 for electrically connecting the contact 114 of the die 110 with the corresponding conductive pad 143. A solder mask 150 is formed on the second dielectric layer 132. Conductive pads 143 are exposed from the solder mask 150 for planting solder balls 160. Therefore, the contacts 114 of the die 110 may fan out to the conductive pads 143 through the first dielectric layer 131 and the second dielectric layer 132, so that it is easy for planting the solder balls 160 and surface-mounting to PCB (print circuit board), etc. However, due to the die 110 of high density (with a lot of terminals), such as CPU chip, a mass of heat is generated from the die 110, so that the heat-dissipation of the package 100 should be improved. The encapsulating material 120 is made of resin etc, that is not excellent in heat-dissipation, so that the die 110 is easy to damage because overheat causes electromigration.

SUMMARY

The main object of the present invention is to provide a semiconductor build-up package. The package comprises a die, a metal carrier and a plurality of dielectric layers. The metal carrier carries the die has a surface for building up a plurality of dielectric layers in order to improve the heat-dissipation of the package.

The secondary object of the present invention is to provide a semiconductor build-up package with vertically conductive columns on the bonding pads of the die. The conductive columns of each dielectric layer, such as copper, aluminum or their alloys, may electrically connect with those conductive columns of adjacent dielectric layer mutually. Some of conductive columns are vertically bonded on the conductive columns of adjacent dielectric layer.

According to the present invention, a semiconductor build-up package comprises a die, a metal carrier and a plurality of dielectric layers. The die has an active surface with bonding pads and a passive surface. The metal carrier has a surface with a cavity for accommodating the die. It is better that the surface of the metal carrier is coplanar to the active surface of the die for providing an area that is necessary to build up a plurality of dielectric layers. The dielectric layers are formed in turn on the area formed by the active surface of the die and the surface of the metal carrier. A plurality of conductive pads are formed on the surface of the dielectric layer of the most upper layer. Each dielectric layer has conductive columns for electrically connecting the corresponding bonding pads of the die with the conductive pads. The conductive columns are made of copper, aluminum or their alloys for providing electrical connection. Further, a plurality of solder balls, bumps or pins are formed on the conductive pads for surface mounting the semiconductor build-up package to a print circuit board, etc. Therefore, a semiconductor package with build-up dielectric layers is especially applied to a semiconductor package with a lot of terminals. By means of conductive traces and conductive columns, the bonding pads of the die fan out to the conductive pads with larger intervals so that it is uneasy to cause the problems of short circuit, etc while the packaging process, planting the solder balls or surface-mounting. Besides, The metal carrier is made of copper, aluminum or other metals with excellent heat-dissipation efficiency and contacts the passive surface and the sides of the die for improved heat dissipation, so the heat generated from die is dissipated fast through the metal carrier for keeping the die from damaging and acting abnormally due to overheat.

DETAILED DESCRIPTION OF THE PRESENT INVENTION

Figure 1:
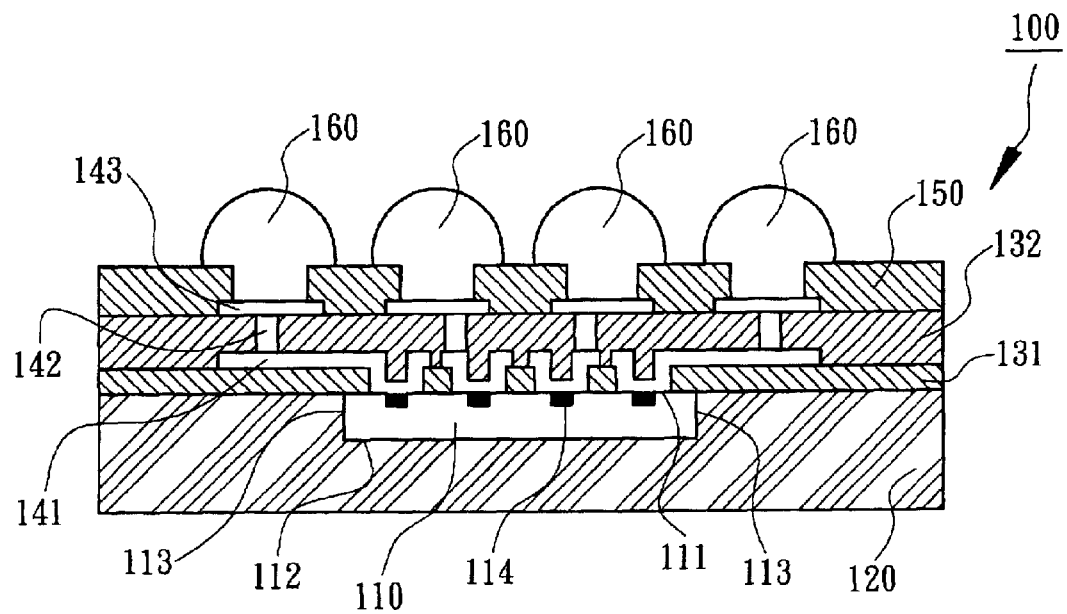
FIG. 1 is a cross-sectional view of a semiconductor build-up package disclosed in U.S. Pat. No. 6,271,469 "direct build-up layer on an encapsulated die package".

Referring to the drawings attached, the present invention will be described by means of the embodiment below.

Figure 2:
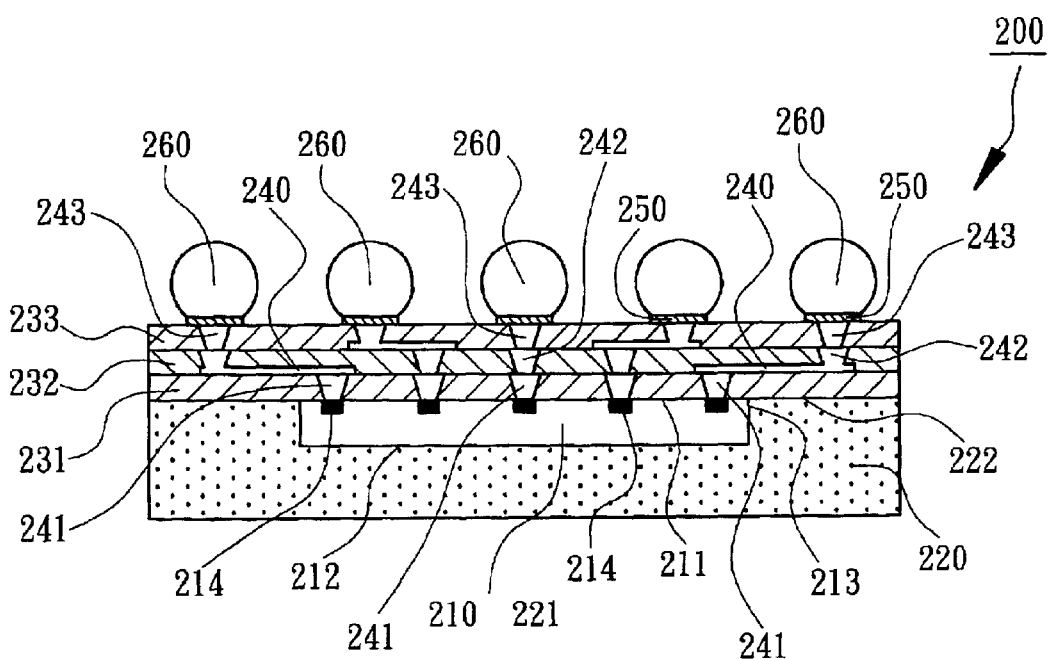
FIG. 2 is a cross-sectional view of a semiconductor build-up package in accordance with an embodiment of the present invention.

In an embodiment of the present invention, FIG. 2 is a cross-sectional view of a semiconductor build-up package. The semiconductor package 200 comprises a die 210, a metal carrier 220 and a plurality of dielectric layers 231, 232, and 233.

As shown in FIG. 2, the die 210, made of silicon, gallium arsenside or other semiconductor material, can be one kind of memory die such as DRAM, SRAM, flash, DDR or Rambus, etc, or microcontroller, microprocessor, logic die, ASIC or radio-frequency die. The die 210 has an active surface 211, a passive surface 212 and sides 213 between thereof. A plurality of bonding pads 214 are formed on the active surface 211. The bonding pads electrically connect with the integrated circuit (not shown in drawings) of the die 210. The metal carrier 220 supports the die 210 in the build-up packaging process. There is a cavity 221 at the center of the metal carrier 220 for accommodating the die 210 so that the passive surface 212 and the sides 213 of the die 210 are covered by the metal carrier 220. The metal carrier 210 is made of copper, aluminum or their alloys and provides a larger area for dissipating heat of the die 210, so a good heat-dissipation can be obtained. It is preferable that the surface 222 of the metal carrier 220 is coplanar to the active surface 211 of the die 210 to provide an enough planar area for building up dielectric layer 231, 232 and 233.

The first dielectric layer 231, the second dielectric layer 232 and the third dielectric layer 233 are made of dielectric materials such as polyimide, epoxy, BT resin FR-4 resin, FR-5 resin, BOB (benezo cyclobutene) or PTFE (polytetrafluoroethylene), etc and are formed in turn on the active surface 211 of the die 210 and the surface 222 of the metal carrier 220. The first dielectric layer 231 formed on the active surface 211 of die 210 and the surface 222 of metal carrier 220 has a plurality of conductive columns 241. The conductive columns 231 are vertically bonded on the corresponding bonding pads 214 of the die 210 for electrical connection. The second dielectric layer 232 is formed on the first dielectric layer 231 and also has a plurality of conductive columns 242. Some of conductive columns 242 of the second dielectric layer 232 are vertically bonded on the conductive columns 241 of the first dielectric layer 231. The third dielectric layer 233 is formed on the second dielectric layer 232 and has a plurality of conductive columns 243. A plurality of conductive pads 250 are formed on the third dielectric layer 233. It Is better that the conductive pads 250 are in grid array fashion. The conductive columns 243 electrically connect with the conductive columns 242 of the second dielectric layer 232 and the conductive pads 250. Some of conductive columns 243 of the third dielectric layer 233 are vertically bonded on the conductive columns 242 of the second dielectric layer 232. There are conductive traces 240 between dielectric layers 231, 232, 233 to electrically connect conductive columns 241, 242 and 243. Therefore, the bonding pads 214 of the die 210 electrically connect with the corresponding conductive pads 250 on the third dielectric layer 233. The conductive columns 241, 242 and 243 are made of copper, aluminum or their alloys for providing excellent electrical connections. Besides, solder balls 260, bumps of pins are formed on the conductive pads 250 for surface-mounting the semiconductor build-up package 200 to print circuit board, etc.

According to the present invention, the first dielectric layer 231, the second dielectric layer 232 and the third dielectric layer 233 of the semiconductor package 200 are built up on the metal carrier 220. The bonding pads 214 of die 210 fan out to the conductive pads 250 through the conductive columns 241, 242 and 243 and conductive traces 240, so that it wouldn't cause the short circuit problems easily. Especially, the die 210 is a high-density chip (having lots of terminals such as CPU chip) and even the intervals between adjacent bonding pads 214 are very small, it wouldn't cause short circuit problems while packaging process, planting the solder balls 260 or surface mounting. So that reliability of the semiconductor package 200 and production yield would increase greatly. Furthermore, the die of high-density (having lots of terminals) is easy to generate massive heat. The die 210 is contained in the cavity 221 of the metal carrier 220. The metal carrier 220 covers the passive surface 212 and sides 213 of the die 210. Besides, the metal carrier 220 is made of copper, aluminum or other metals with excellent heat dissipation efficiency and contacts the die with a larger area for heat dissipating, so the heat generated from the die 210 is dissipated fast through the metal carrier 220 for keeping the die from damaging due to overheat.

The above description of embodiments of this invention is intended to be illustrated and not limiting. Other embodiments of this invention will be obvious to those skilled in the art in view of the above disclosure.

What is claimed is:

1. A semiconductor build-up package comprising:
    a) a die having an active surface, a passive surface, and sides between the active surface and the passive surface;
    b) a plurality of bonding pads electrically connected to the active surface of the die;
    c) a carrier made only of metal and having a cavity in a top surface, the die being positioned within the cavity such that the passive surface and sides are within the cavity; and
    d) a plurality of dielectric layers formed on the active surface of the die and the top surface of the metal carrier, each plurality of dielectric layers having a plurality of conductive columns electrically connected to the bonding pads of the die and a plurality of conductive traces electrically connecting corresponding conductive columns of one plurality of dielectric layers to corresponding conductive columns of another plurality of dielectric layers.

2. The semiconductor build-up package according to claim 1, wherein the plurality of dielectric layers includes three dielectric layers.

3. The semiconductor build-up package according to claim 1, wherein the die being positioned within the cavity such that the active surface of the die is coplanar with the top surface of the metal carrier.

4. The semiconductor build-up package according to claim 1, wherein at least one of the plurality of conductive columns of each plurality of dielectric layers is vertically connected to at least one of the plurality of conductive columns of an adjacent plurality of dielectric layers.

5. The semiconductor build-up package according to claim 1, further comprising a plurality of conductive pads, wherein one of the plurality of conductive pads is electrically connected to one of the plurality of conductive columns on the outer most plurality of dielectric layers.

6. The semiconductor build-up package according to claim 5, further comprising a plurality of connectors selected from the group consisting of solder balls, bumps, and pins, wherein one of the plurality of connectors is electrically connected to each of the plurality of conductive pads.

7. The semiconductor build-up package according to claim 5, wherein the plurality of conductive pads are arranged to form a grid array.

8. The semiconductor build-up package according to claim 1, wherein the plurality of dielectric layers are made from a dielectric material selected from the group consisting of polyimide, epoxy, BT resin, FR-4 resin, FR-5 resin, benezo cyclobutene (BCB), and polytetrafluroethylene (PIFE).

9. The semiconductor build-up package according to claim 1, wherein the metal carrier is made from a metal selected from the group consisting of aluminum, aluminum alloy, copper, and copper alloy.

10. The semiconductor build-up package according to claim 1, wherein the plurality of conductive columns are made from a metal material selected from the group consisting of aluminum, aluminum alloy, copper, and copper alloy.

11. The semiconductor build-up package according to claim 1, wherein the metal carrier covers the passive surface and the sides of the die.

* * * * *